US 6,740,580 B1

(12) United States Patent
Gupta et al.

(10) Patent No.: US 6,740,580 B1
(45) Date of Patent: May 25, 2004

(54) METHOD TO FORM COPPER INTERCONNECTS BY ADDING AN ALUMINUM LAYER TO THE COPPER DIFFUSION BARRIER

(75) Inventors: Subhash Gupta, Singapore (SG); Chyi S. Chern, Singapore (SG); Mei Sheng Zhou, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 09/389,633

(22) Filed: Sep. 3, 1999

(51) Int. Cl.[7] ............... H01L 21/4763; H01L 21/44
(52) U.S. Cl. ............ 438/627; 438/618; 438/628; 438/633; 438/637; 438/687
(58) Field of Search ................. 438/627, 628, 438/629, 687, 633, 692, 675, 678, 643, 685, 653, 631, 654, 618

(56) References Cited

U.S. PATENT DOCUMENTS

| | | | |
|---|---|---|---|
| 5,164,332 A | 11/1992 | Kumar | 437/198 |
| 5,674,787 A | 10/1997 | Zhao et al. | 438/627 |
| 5,695,810 A | 12/1997 | Dubin et al. | 427/96 |
| 5,714,418 A * | 2/1998 | Bai et al. | 438/627 |
| 5,747,360 A * | 5/1998 | Nulman | 438/648 |
| 5,801,100 A | 9/1998 | Lee et al. | 438/678 |
| 5,821,168 A | 10/1998 | Jain | 438/692 |
| 5,891,513 A * | 4/1999 | Dubin et al. | 427/98 |
| 5,939,788 A | 8/1999 | McTeer | 257/751 |

FOREIGN PATENT DOCUMENTS

| | | | |
|---|---|---|---|
| EP | 0878843 | 11/1998 | H01L/29/768 |
| JP | 09097792 | 4/1997 | H01L/21/321 |
| NL | WO9832175 | 7/1998 | H01L/29/417 |

* cited by examiner

*Primary Examiner*—Charles Bowers
*Assistant Examiner*—Hsien Ming Lee
(74) *Attorney, Agent, or Firm*—George O. Saile; Rosemary L. S. Pike

(57) ABSTRACT

A method to form copper interconnects is described. The method may be used to form single or dual damascene interconnects. The addition of an aluminum barrier layer to the conventional barrier layer creates a superior barrier to copper diffusion. A substrate layer is provided. A dielectric layer is deposited overlying the substrate layer. The dielectric layer patterned to form interconnect trenches. An optional titanium adhesion layer may be deposited. An aluminum barrier layer is deposited overlying the interior surfaces of the trenches. A second barrier layer, comprising for instance titanium and titanium nitride, is deposited overlying the aluminum barrier layer. A copper layer is deposited overlying the second barrier layer and filling the interconnect trenches. The copper layer, the second barrier layer, and the aluminum barrier layer are polished down to the top surface of the dielectric layer to define the copper interconnects, and complete the fabrication of the integrated circuit device.

22 Claims, 5 Drawing Sheets

METHOD TO FORM COPPER INTERCONNECTS BY ADDING AN ALUMINUM LAYER TO THE COPPER DIFFUSION BARRIER

BACKGROUND OF THE INVENTION (1) Field of the Invention

The present invention relates to the fabrication of semiconductor structures, and more particularly, to a method to form copper interconnects using an aluminum layer as gettering agent in the copper diffusion barrier layer in the manufacture of integrated circuits.

(2) Description of the Prior Art

As integrated circuit feature sizes continue to decrease, it has become advantageous to construct metal connections out of copper instead of aluminum. Copper has a lower resistivity than aluminum, and therefore can form higher speed connections for a given line width.

To use copper effectively in an integrated circuit technology, however, the problem of copper diffusion into other materials must be addressed. For example, copper diffuses into common dielectrics, such as silicon dioxide, much more easily than does aluminum. This phenomenon can cause electrical leakage paths and shorts in the completed circuit.

Referring to FIG. 1, a cross-section of a partially completed prior art copper interconnect structure is shown. Because copper is more difficult to reliably etch than aluminum, a damascene approach is typically used to form copper interconnects. A substrate layer 10 is depicted. The substrate layer 10 encompasses all underlying layers, devices, junctions, and other features that have been formed prior to the deposition and definition of metal traces (Cu, Al, W, etc.,) 18 in an isolation layer 14. A dielectric layer 22 overlies the isolation layer 14 and the copper traces 18.

Via openings are formed in the dielectric layer 22 to expose the top surfaces of the conductive traces 18. The via openings are typically etched using a reactive ion etch and then cleaned. In the process of etching and cleaning the vias, however, copper from the copper traces 18 can contaminate the sidewalls 26 of the vias.

Referring now to FIG. 2, a barrier layer 30 is deposited overlying the dielectric layer 22 and the exposed conductive traces 18. A copper layer will subsequently be deposited overlying the barrier layer 30 to fill the vias. The purpose of the barrier layer 30 is to prevent copper out diffusion into the dielectric layer 22 while establishing a low resistance contact path to the underlying copper traces 18. This barrier layer 30 is commonly comprised of tantalum, tantalum nitride or both tantalum and tantalum nitride.

The use of tantalum and tantalum nitride for the diffusion barrier creates two problems however. First, while the tantalum enhances the field adhesion for the copper layer, the chemical inertness and mechanical hardness of tantalum makes this barrier layer difficult to planarize in later process steps. Second, the tantalum and tantalum nitride barrier layer 30 cannot act as a copper plating catalyst. Therefore, a copper seed layer has to be deposited for subsequent copper plating by either electrochemical copper plating or electroless copper plating.

Unfortunately, the commonly used technology for depositing the tantalum, tantalum nitride, and copper seed layer is physical vapor deposition (PVD). The PVD technology provides relatively poor step coverage. Therefore, a substantial minimum thickness of barrier layer 30 is required. When coupled with the requirement of the additional copper seed layer, the process of the prior art is not extendible to the very small feature sizes of the future technology.

Several prior art approaches attempt to improve the barrier layer in copper interconnect processes for use in integrated circuit metalization. U.S. Pat. No. 5,695,810 to Dubin et al discloses a process to form a barrier layer composed of cobalt tungsten phosphide (CoWP) for copper interconnects. The prior art section also discusses barrier layers of Ta, Mo, W, TiW, TiN, WN, TiSiN, Ni, Co, and Ni—Co alloys. U.S. Pat. No. 5,801,100 to Lee et al teaches the use of a nickel containing layer as a copper diffusion barrier in an interconnect process. U.S. Pat. No. 5,821,168 to Jain discloses a process to form copper structures where an insulating layer is nitrided to form a barrier layer. An adhesion layer of silicon, silicon germanium, germanium, magnesium, or titanium is then deposited before the electroplating of copper. U.S. Pat. No. 5,674,787 to Zhao et al teaches a process to selectively deposit copper to form interconnects. Barrier layers of TiN, TiW, Ta, TaN, and WN are disclosed.

SUMMARY OF THE INVENTION

A principal object of the present invention is to provide an effective and very manufacturable method of fabricating integrated circuits with copper interconnects.

A further object of the present invention is to provide a method of fabricating copper interconnects with a diffusion barrier partially comprising aluminum.

A yet further object of the present invention is to form an improved barrier layer comprising aluminum and a second barrier material where the improved barrier layer further inhibits copper diffusion.

Another yet further object of the present invention is to form an improved barrier layer comprising aluminum and a second barrier material where the improved barrier layer has a much lower resistance.

Another further object of the present invention is to form an improved barrier layer comprising aluminum and a second barrier material where the second barrier layer provides a catalyst layer for seedless electrochemical or electroless copper plating.

In accordance with the objects of this invention, a new method of fabricating an integrated circuit with copper interconnects is achieved. A substrate layer is provided encompassing all underlying layers, devices, and junctions. Metal traces—Cu, Al, W, etc., are provided in a first dielectric layer. A second dielectric layer is deposited overlying the metal traces and the first dielectric layer. The second dielectric layer is patterned to form interconnect trenches for single or dual damascene interconnect structures. An aluminum barrier layer is deposited overlying the second dielectric layer and the exposed metal traces. A second barrier layer is deposited overlying the aluminum barrier layer. A copper layer is deposited overlying the second barrier layer and filling the interconnect trenches. The copper layer, second barrier layer, and aluminum barrier layer are polished down to the top surface of the second dielectric layer to define copper interconnects. An encapsulation layer is deposited overlying the copper interconnects and the second dielectric layer. A passivation layer is deposited overlying the encapsulation layer to complete the fabrication of the integrated circuit device.

In addition, in accordance with the objects of this invention, a new method of fabricating an integrated circuit with copper interconnects is achieved. A substrate layer is provided encompassing all underlying layers, devices, and junctions. Metal traces—Cu, Al, W, etc., are provided in a first dielectric layer. A second dielectric layer is deposited overlying the metal traces and the first dielectric layer. The second dielectric layer is patterned to form interconnect trenches for single or dual damascene interconnect structures. A titanium adhesion layer is deposited overlying the second dielectric layer and the exposed metal traces. An aluminum barrier layer is deposited by a high temperature process overlying the titanium adhesion layer. A second barrier layer is deposited overlying the aluminum barrier layer. A copper layer is deposited overlying the second barrier layer and filling the interconnect trenches. The copper layer, second barrier layer, aluminum barrier layer and titanium adhesion layer are polished down to the top surface of the second dielectric layer to define copper interconnects. An encapsulation layer is deposited overlying the copper interconnects and the second dielectric layer. A passivation layer is deposited overlying the encapsulation layer to complete the fabrication of the integrated circuit device.

BRIEF DESCRIPTION OF THE DRAWINGS

In the accompanying drawings forming a material part of this description, there is shown.

DESCRIPTION OF THE PREFERRED EMBODIMENTS

Figure 1:
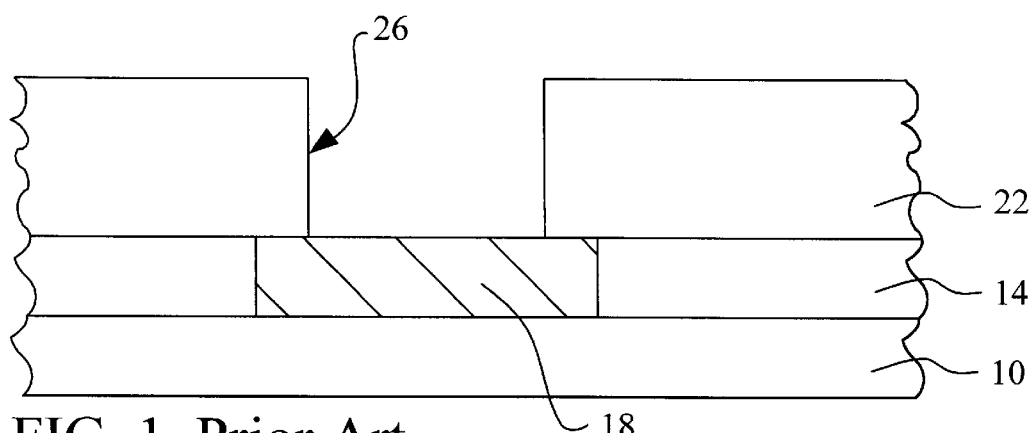
FIGS. 1 and 2 schematically illustrate in cross-section a partially completed prior art integrated circuit using a conventional barrier layer.
Figure 2:
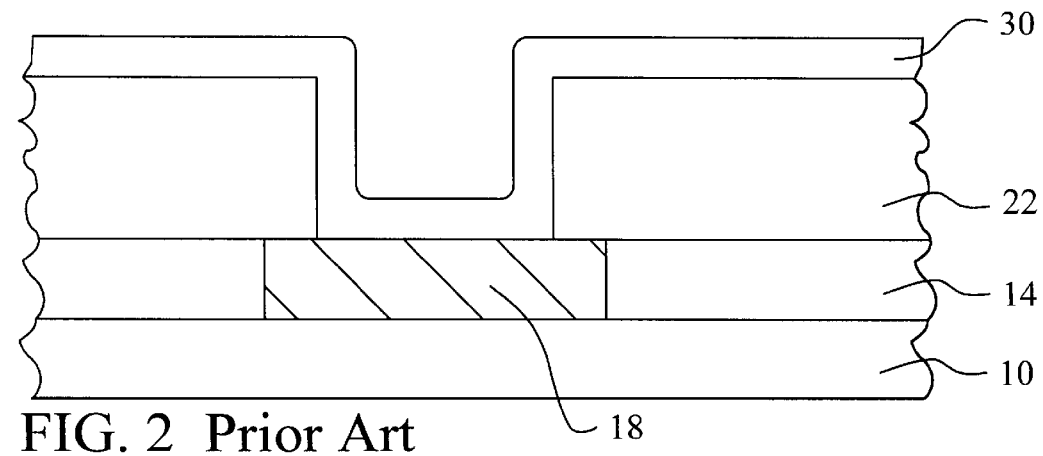
Figure 3:
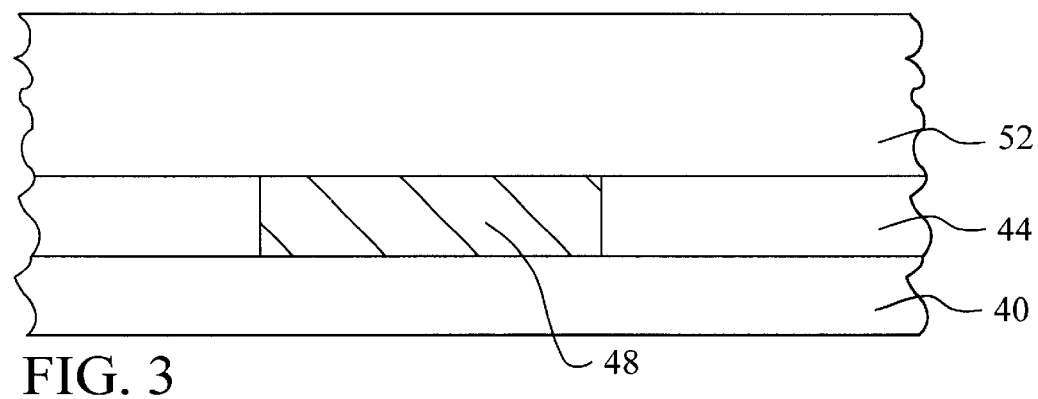
FIGS. 3 through 9 schematically illustrate in cross-sectional representation a first embodiment of the present invention used to create copper interconnects.

Referring now more particularly to FIG. 3, there is illustrated a portion of a partially completed integrated circuit. In the preferred embodiments, the present invention will be used to create copper interconnects. In the illustrations of the first and second embodiments, the present invention is described for a single damascene interconnection. It should be obvious to those skilled in the art that the essential ideas of the invention could be applied to dual damascene interconnects with little, or no, changes. It will be understood by those skilled in the art that the invention could be applied to the formation of other copper structures.

In the first embodiment of the present invention, a substrate 40 is provided encompassing all underlying layers, devices, junctions, and other features that have been formed prior to the deposition of a first dielectric layer 44. Metal traces (Cu, Al, W, etc.,) 48 are provided in the first dielectric layer 44 to illustrate the present invention used in the formation of interconnects connected to underlying traces. A second dielectric layer 52 is deposited overlying the metal traces 48 and the first dielectric layer 44. The second dielectric layer 52 is preferably composed of an oxide such as a low k-value fluorinated silicate glass (FSG) which is planarized after deposition. Preferably, the second dielectric layer 52 is deposited to a thickness of between about 4,000 Angstroms and 20,000 Angstroms, depending, for example, if the interconnects are single or dual damascene.

Figure 4:
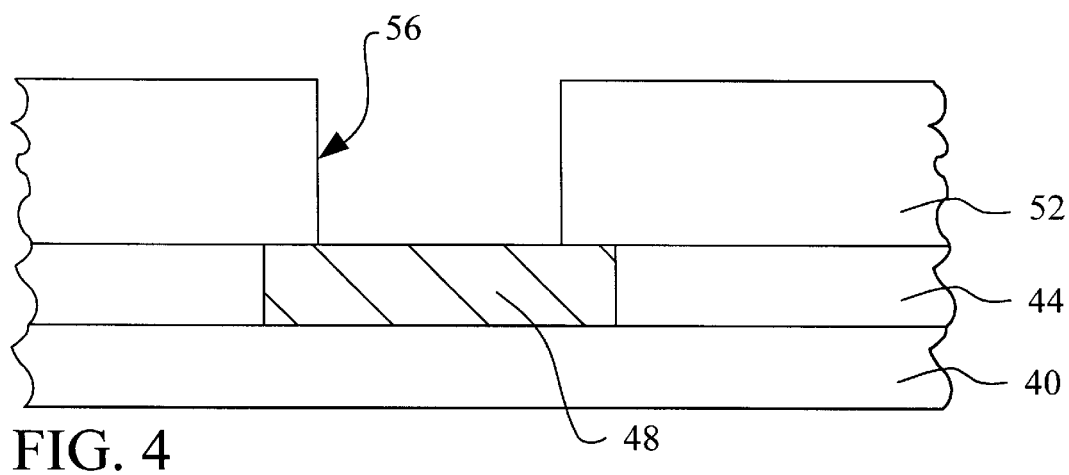

Referring now to FIG. 4, the second dielectric layer 52 is etched through to the underlying metal traces 48 where the dielectric layer 52 is not protected by a photoresist mask which is not shown. This etching step forms the interconnect trenches. The interconnect trenches are etched by a conventional reactive ion etch (RIE). As illustrated in the prior art analysis, this etching step can create copper contamination 56 on the sidewalls of the interconnect trenches.

Figure 5:
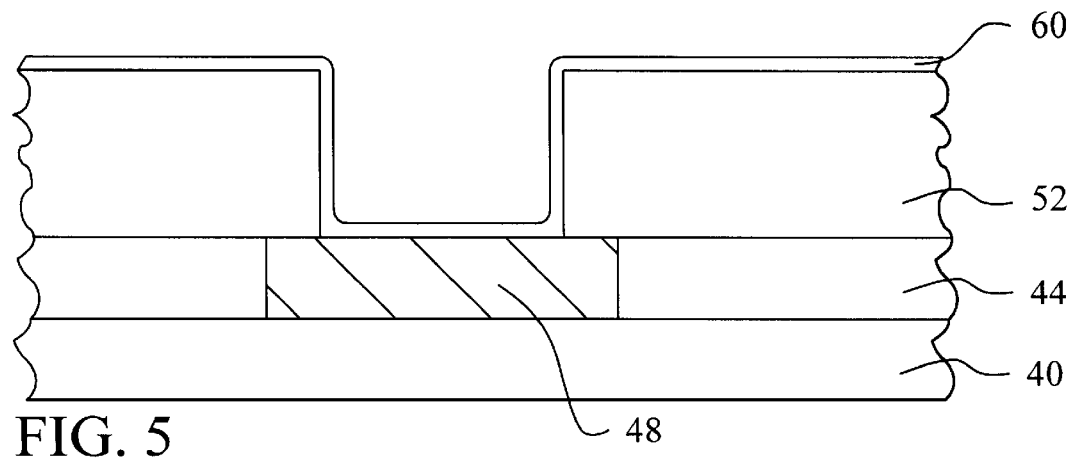

Referring now to FIG. 5, an important aspect of the present invention is described. An aluminum barrier layer 60 is deposited overlying the second dielectric layer 52 and the exposed metal traces 48. The aluminum barrier layer 60 is herein used as an addition to a conventional barrier such as titanium, titanium nitride, or both titanium and titanium nitride, which will be deposited subsequently. The conventional barrier is a good thermal barrier. However, it may not be an adequate barrier to copper ion diffusion. The addition of the aluminum barrier layer 60 creates a superior composite barrier due to the special properties of the aluminum.

First, aluminum can form a solid-state solution with copper at the Al—Cu interface. Because of the high solubility of copper in aluminum, Cu ions and atoms do not diffuse through the aluminum barrier layer 60 from a kinetic standpoint. Second, aluminum also acts as a gettering agent for copper. Any free copper ions or atoms in the area of the aluminum barrier layer 60 will be absorbed into the aluminum. This provides a solution to the problem of copper contamination 56 of the trench sidewalls. The free copper is gettered by the aluminum barrier layer 60 and does not then act as a source of future diffusion problems in the second dielectric layer 52. Finally, the low resistivity of aluminum provides a low resistance contact path between the conductive traces 48 and the subsequently formed copper interconnects.

The aluminum barrier layer 60 may be deposited using either chemical vapor deposition or physical vapor deposition. The aluminum barrier layer 60 so formed has a thickness of between about 50 Angstroms and 300 Angstroms.

In addition to aluminum, it may be possible to extend the approach of the present invention to other metallurgical materials. For example, other low resistivity metals, such as gold, silver, zinc, cobalt, nickel and tungsten, could be used instead of aluminum to create enhanced composite copper barriers.

Figure 6:
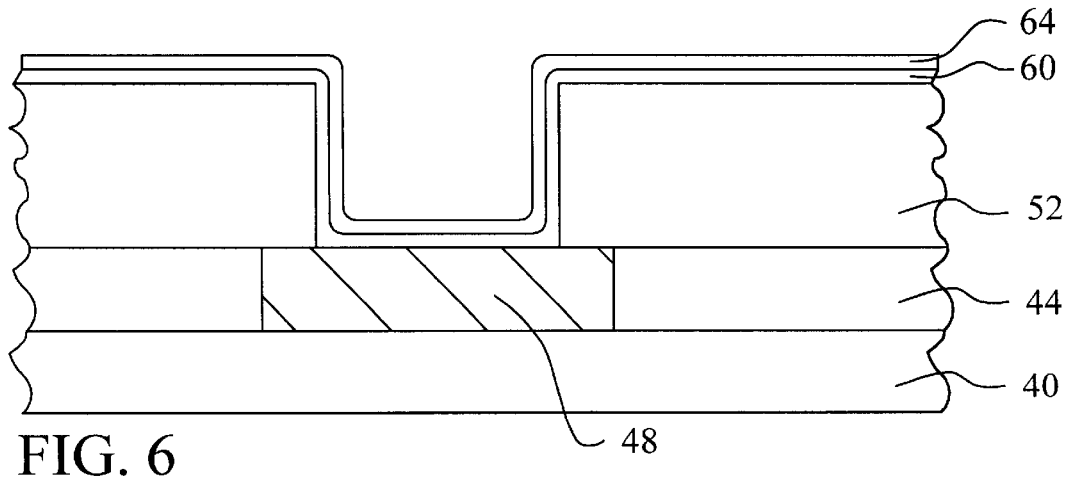

Referring now to FIG. 6, another important part of the present invention is shown. A second barrier layer 64 is deposited overlying the aluminum barrier layer 60. The second barrier layer 64 serves two purposes. First, the second barrier layer 64 inhibits copper thermal outdiffusion. Second, the second barrier layer 64 may serve as a catalyst for the seedless plating of the copper layer. The second barrier layer 64 may be comprised of one of several different refractory metal nitrides and silicon nitrides, including TiN, MoN, WN, MoSiN, and WSiN. In this preferred embodiment, the second barrier layer 64 is composed of a combined layer of titanium and titanium nitride (Ti/TiN). The combined layer of titanium and titanium nitride may be deposited using either a chemical vapor deposition (CVD), a ionized metal plating (IMP), or a physical vapor deposition (PVD) process. The second barrier layer 64 so formed has a thickness of between about 50 Angstroms and 300 Angstroms.

Figure 7:
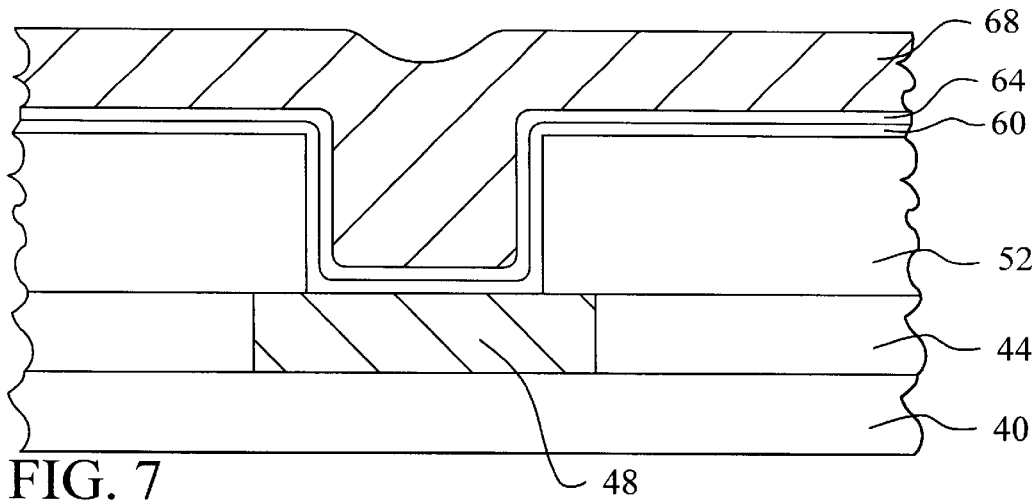

Referring now to FIG. 7, a copper layer 68 is deposited overlying the second barrier layer 64 and filling the interconnect trenches. The copper layer 68 may be deposited using chemical vapor deposition (CVD), physical vapor deposition (PVD), electrochemical copper plating, or an electroless copper plating. In the preferred embodiment, the copper layer 68 is deposited using an electrochemical copper plating operation to a thickness of between about 6,000 Angstroms and 20,000 Angstroms. The thickness depends on whether a single or dual damascene interconnect is formed. The second barrier layer 64 may act as a catalyst to allow the plating operation to proceed without the expensive formation of a copper seed layer.

Figure 8:
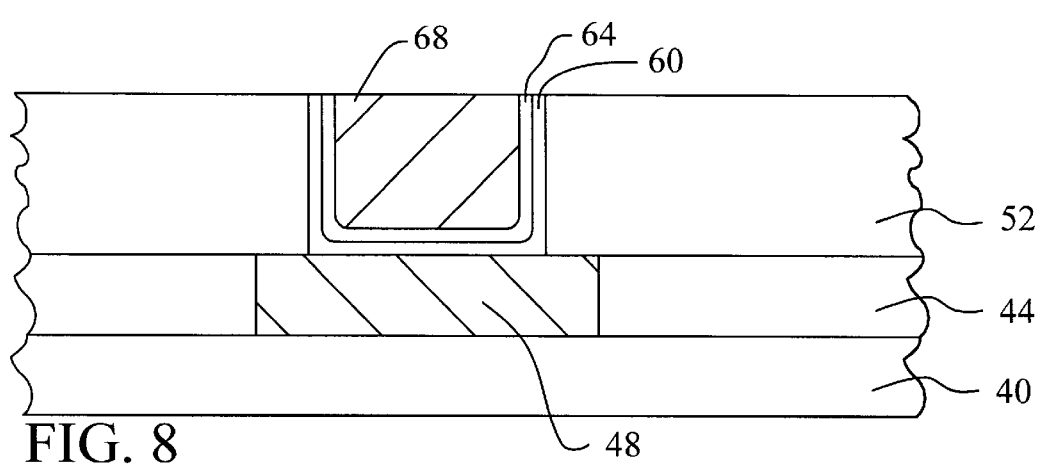

Referring now to FIG. 8, the copper layer 68, second barrier layer 64, and aluminum barrier layer 60 are polished down to the top surface of the second dielectric layer 52 to define copper interconnects. This step is accomplished via a conventional chemical mechanical polishing (CMP) operation. In this step, the advantage of using only aluminum and the Ti/TiN layer is realized. It is easier to reliably polish down these layers when compared to the conventional tantalum-based barrier layer used in the prior art. Thus, the present invention improves the process capability when compared to the prior art.

Figure 9:
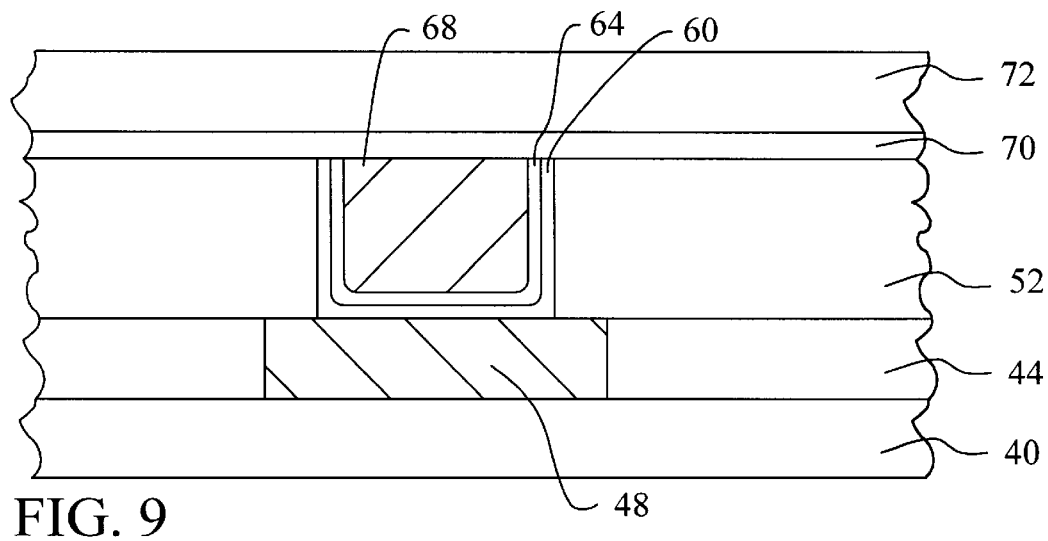

Referring now to FIG. 9, an encapsulation layer 70 is deposited overlying the copper interconnects and the second dielectric layer 52. The encapsulation layer 70 is preferably composed of silicon nitride deposited by chemical vapor deposition (CVD) to a thickness of between about 300 Angstroms and 2,000 Angstroms. The encapsulation layer 70 provides a final copper diffusion barrier over the top of the copper interconnects. A passivation layer 72, of plasma nitride, is then deposited overlying the encapsulation layer 70 to complete the fabrication of the integrated circuit device.

Figure 10:
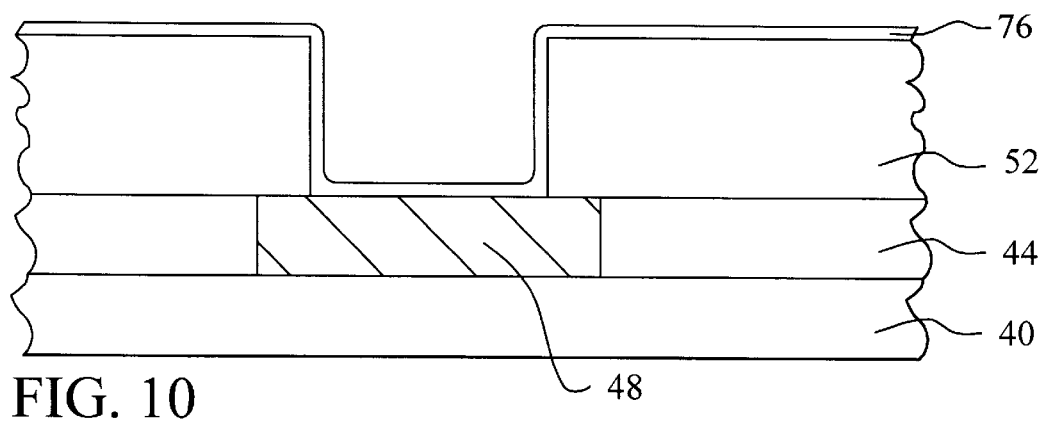
FIGS. 10 through 15 schematically illustrate in cross-sectional representation a second embodiment of the present invention used to create copper interconnects.

Referring now to FIG. 10, a second preferred embodiment of the present invention is illustrated. After the formation of the interconnect trenches in FIG. 4, an additional process step is inserted into the sequence. As shown in FIG. 10, a titanium adhesion layer 76 is deposited overlying the second dielectric layer 52 and the exposed metal traces 48. The titanium adhesion layer 76 is used if the aluminum will be deposited by a high temperature process. The titanium adhesion layer 76 improves the adhesion of aluminum deposited by this process. In this preferred embodiment, the titanium adhesion layer 76 is deposited by ionized metal plating (IMP) or by physical vapor deposition (PVD). The titanium adhesion layer 76 so formed has a thickness of between about 30 Angstroms and 200 Angstroms.

Figure 11:
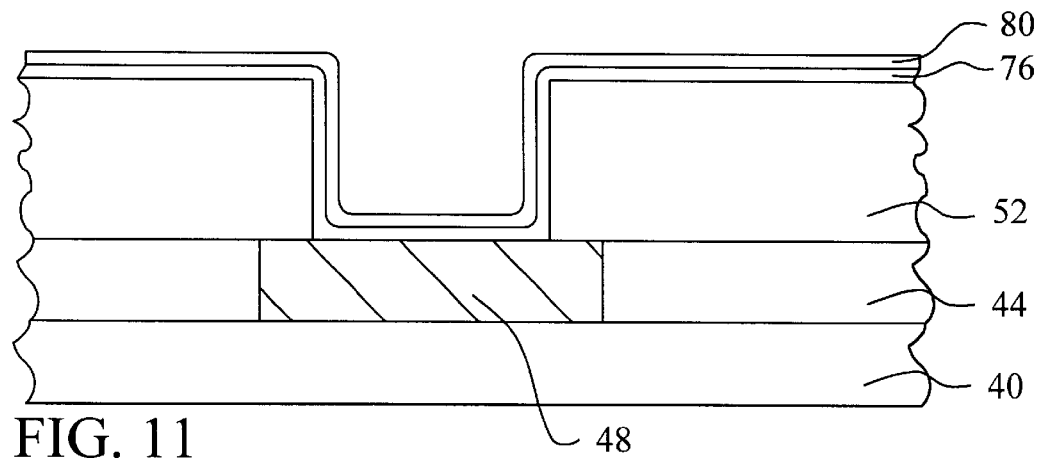

Referring now to FIG. 11, the second preferred embodiment process continues in the same sequence as the first preferred embodiment. The aluminum barrier layer 80 is deposited overlying the titanium adhesion layer 76. In this embodiment, the aluminum barrier layer 80 is deposited by physical vapor deposition (PVD) or chemical vapor deposition (CVD). This process is chosen to achieve improved step coverage of the aluminum over surface features. The aluminum barrier layer 80 so formed has a thickness of between about 50 Angstroms and 300 Angstroms.

Figure 12:
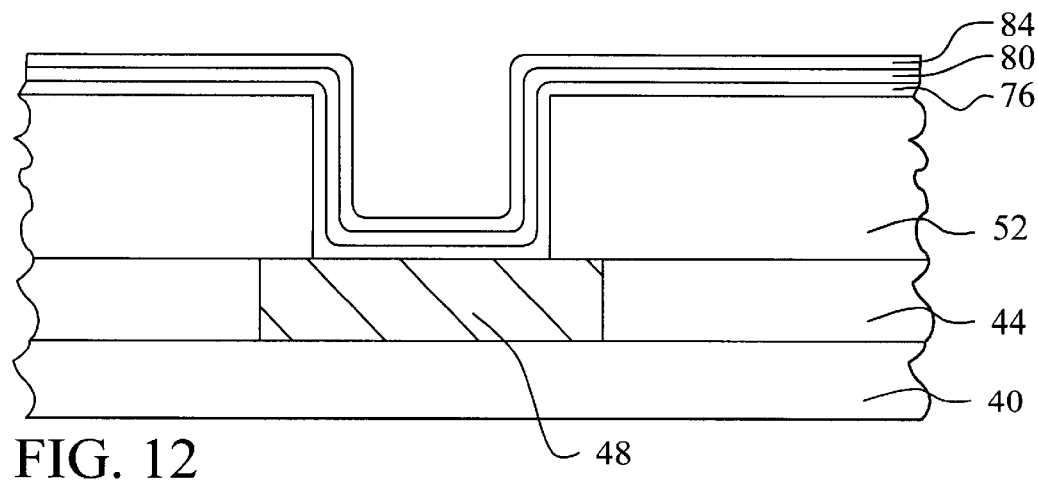

Referring now to FIG. 12, a second barrier layer 84 is deposited overlying the aluminum barrier layer 80. The second barrier layer 84 may be comprised of one of several different refractory metal nitrides and silicon nitrides, including TiN, MoN, WN, MoSiN, and WSiN. In this preferred embodiment, the second barrier layer 84 is composed of a combined layer of titanium and titanium nitride (Ti/TiN) deposited by chemical vapor deposition (CVD), ionized metal plating (IMP), or physical vapor deposition (PVD). The second barrier layer 84 so formed has a thickness of between about 30 Angstroms and 300 Angstroms.

Figure 13:
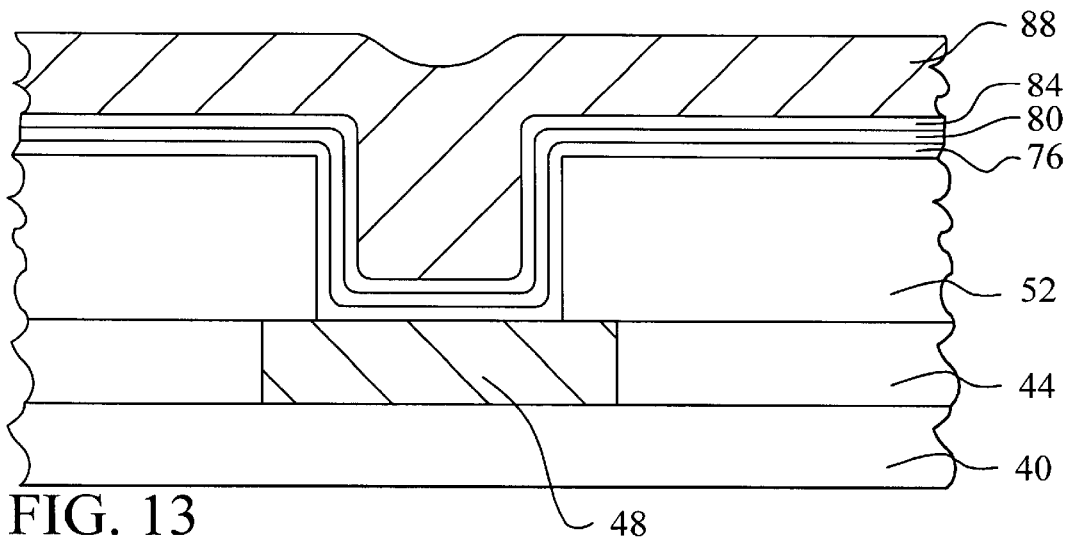

Referring now to FIG. 13, a copper layer 88 is deposited overlying the second barrier layer 84 and filling the interconnect trenches. The copper layer 88 may be deposited using chemical vapor deposition (CVD), physical vapor deposition (PVD), electrochemical copper plating, or electroless copper plating. In this preferred embodiment, the copper layer 88 is deposited using electrochemical copper plating to a thickness of between about 6,000 Angstroms and 20,000 Angstroms. The thickness of the copper layer 88 depends on whether a single or dual damascene structure is formed.

Figure 14:
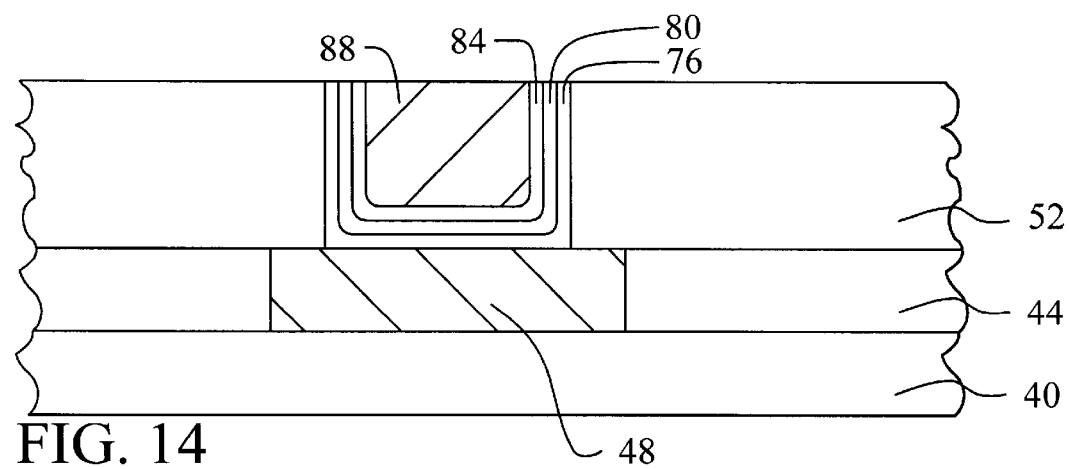

Referring now to FIG. 14, the copper layer 88, second barrier layer 84, aluminum barrier layer 80, and titanium adhesion layer 76 are polished down to the top surface of the second dielectric layer 52 to define copper interconnects. This step is accomplished via a conventional chemical mechanical polishing (CMP) operation. As before, the advantage of using only titanium, aluminum and the Ti/TiN layer is realized. It is easier to reliably polish down these layers when compared to the conventional tantalum-based barrier layer of the prior art. Thus, the present invention improves the process capability when compared to the prior art.

Figure 15:
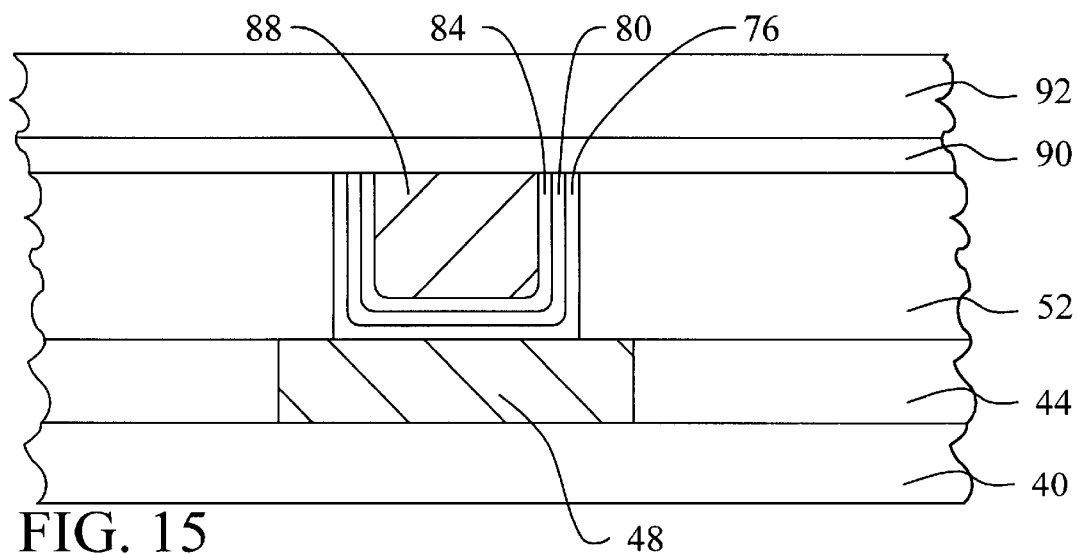

Referring now to FIG. 15, an encapsulation layer 90 is deposited overlying the copper interconnects and the second dielectric layer 52. The encapsulation layer 90 is preferably composed of silicon nitride deposited by chemical vapor deposition (CVD) to a thickness of between about 300 Angstroms and 2,000 Angstroms. The encapsulation layer 90 provides a final copper diffusion barrier over the top of the copper interconnects. A passivation layer 92, of plasma nitride, is then deposited overlying the encapsulation layer 90 to complete the fabrication of the integrated circuit device.

The process of the present invention provides a very manufacturable method for fabricating copper interconnects with a copper diffusion barrier layer and gettering agent comprised of aluminum in the fabrication of an integrated circuit device.

While the invention has been particularly shown and described with reference to the preferred embodiments thereof, it will be understood by those skilled in the art that various changes in form and details may be made without departing from the spirit and scope of the invention.

What is claimed is:

1. A method to form copper interconnects in the fabrication of an integrated circuit device comprising:

providing a substrate layer encompassing all underlying layers, devices, junctions, and other features;

depositing a dielectric layer overlying said substrate layer;

patterning said dielectric layer to form interconnect trenches where copper interconnects are planned;

depositing an aluminum barrier layer overlying said dielectric layer and the internal surfaces of said interconnect trenches;

depositing a second barrier layer overlying said aluminum barrier layer;

depositing a copper layer overlying said second barrier layer and filling said interconnect trenches;

polishing down said copper layer, said aluminum barrier layer, and said second barrier layer to the top surface of said dielectric layer and thereby defining said copper interconnects; and completing the fabrication of the integrated circuit device.

2. The method according to claim 1 wherein said aluminum barrier layer is deposited to a thickness of between about 50 Angstroms and 300 Angstroms.

3. The method according to claim 1 further comprising depositing a titanium adhesion layer overlying said dielectric layer and the interior surfaces of said interconnect trenches prior to depositing said aluminum barrier layer.

4. The method according to claim 1 wherein said interconnect trenches are single damascene structures.

5. The method according to claim 1 wherein said interconnect trenches are dual damascene structures.

6. The method according to claim 1 wherein said second barrier layer comprises one of the group containing: TiN, MoN, WN, MoSiN, and WSiN.

7. The method according to claim 1 wherein said second barrier layer comprises a composite layer of titanium and titanium nitride deposited to a thickness of between about 50 Angstroms and 300 Angstroms.

8. The method according to claim 1 wherein said step of depositing a copper layer is by electrochemical plating depositing copper to a thickness of between about 6,000 Angstroms and 20,000 Angstroms.

9. A method to form copper interconnects in the fabrication of an integrated circuit device comprising:

providing a substrate layer encompassing all underlying layers, devices, junctions, and other features;

providing first metal traces in a first dielectric layer overlying said substrate;

depositing a second dielectric layer overlying said first metal traces and said first dielectric layer;

patterning said second dielectric layer to form interconnect trenches to expose top surfaces of said metal traces where copper interconnects are planned;

depositing an aluminum barrier layer overlying said second dielectric layer, the internal surfaces of said interconnect trenches, and said exposed top surfaces of said metal traces;

depositing a second barrier layer comprising titanium and titanium nitride overlying said aluminum barrier layer;

depositing a copper layer overlying said second barrier layer and filling said interconnect trenches;

polishing down said copper layer, said second barrier layer, and said aluminum barrier layer to the top surface of said second dielectric layer and thereby defining said copper interconnects; and completing the fabrication of the integrated circuit device.

10. The method according to claim 9 wherein said metal traces comprise at least one of the group containing copper, aluminum, and tungsten.

11. The method according to claim 9 wherein said aluminum barrier layer is deposited to a thickness of between about 50 Angstroms and 300 Angstroms.

12. The method according to claim 9 further comprising depositing a titanium adhesion layer overlying said second dielectric layer, said internal surfaces of said interconnect trenches, and said exposed top surfaces of said metal traces prior to depositing said aluminum barrier layer.

13. The method according to claim 9 wherein said interconnect trenches are single damascene structures.

14. The method according to claim 9 wherein said interconnect trenches are dual damascene structures.

15. The method according to claim 9 wherein said second barrier layer is deposited to a thickness of between about 50 Angstroms and 300 Angstroms.

16. The method according to claim 9 wherein said step of depositing a copper layer is by electrochemical plating depositing copper to a thickness of between about 6,000 Angstroms and 20,000 Angstroms.

17. A method to form copper interconnects in the fabrication of an integrated circuit device comprising:

providing a substrate layer encompassing all underlying layers, devices, junctions, and other features;

providing first metal traces in a first dielectric layer overlying said substrate;

depositing a second dielectric layer overlying said first metal traces and said first dielectric layer;

patterning said second dielectric layer to form interconnect trenches to expose top surfaces of said metal traces where copper interconnects are planned;

depositing a titanium adhesion layer overlying said second dielectric layer, the internal surfaces of said interconnect trenches, and said exposed top surfaces of said metal traces;

depositing an aluminum barrier layer overlying said titanium adhesion layer;

depositing a second barrier overlying said aluminum barrier layer;

depositing a copper layer overlying said second barrier layer and filling said interconnect trenches;

polishing down said copper layer, said second barrier layer, said aluminum barrier layer, and said titanium adhesion layer to the top surface of said second dielectric layer and thereby defining said copper interconnects; and completing the fabrication of the integrated circuit device.

18. The method according to claim 17 wherein said metal traces comprise at least one of the group containing copper, aluminum, and tungsten.

19. The method according to claim 17 wherein said aluminum barrier layer is deposited to a thickness of between about 50 Angstroms and 300 Angstroms.

20. The method according to claim 17 wherein said titanium adhesion layer is deposited to a thickness of between about 30 Angstroms and 200 Angstroms.

21. The method according to claim 17 wherein said second barrier layer comprises one of the group containing: Ti/TIN, TiN, MoN, WN, MoSiN, and WsiN and is deposited to a thickness of between about 50 Angstroms and 300 Angstroms.

22. The method according to claim 17 wherein said step of depositing a copper layer is by electrochemical plating and deposits copper to a thickness of between about 6,000 Angstroms and 20,000 Angstroms.

* * * * *